United States Patent [19]

Takemoto et al.

[11] 4,301,477

[45] Nov. 17, 1981

[54] SOLID-STATE IMAGING DEVICE

[75] Inventors: Iwao Takemoto, Kodaira; Masaharu Kubo, Hachioji; Shinya Ohba, Kokubunji; Shuhei Tanaka, Higashiyamato; Masakazu Aoki, Hachioji, all of Japan

[73] Assignees: Hitachi, Ltd.; Hitachi Denshi Kabushiki Kaisha, both of Tokyo, Japan

[21] Appl. No.: 120,115

[22] Filed: Feb. 11, 1980

[30] Foreign Application Priority Data

Feb. 21, 1979 [JP] Japan .................. 54-18343

[51] Int. Cl.³ .................. H04N 5/30; H04N 3/14
[52] U.S. Cl. .................. 358/213
[58] Field of Search .................. 358/166, 167, 213

[56] References Cited

U.S. PATENT DOCUMENTS 4,189,749 2/1980 Hiroshima et al. .................. 358/213 X Primary Examiner—Robert L. Richardson
Attorney, Agent, or Firm—Craig and Antonelli

[57] ABSTRACT

In a solid-state imaging device comprising photodiodes arranged in a two-dimensional array, vertical and horizontal switching MOS transistors for selecting the photodiodes, vertical and horizontal scanning circuits for supplying scanning pulses to the gate electrodes of the vertical and horizontal switching MOS transistors respectively, a signal switching gate MOS transistor is connected between a signal output terminal and a horizontal signal output line connecting in common the horizontal switching MOS transistors.

11 Claims, 12 Drawing Figures

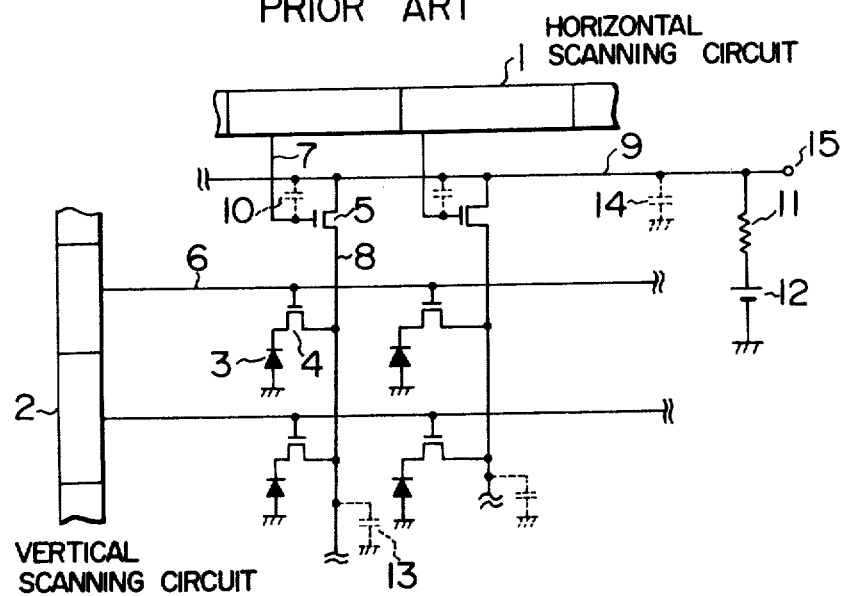
FIG. I
PRIOR ART
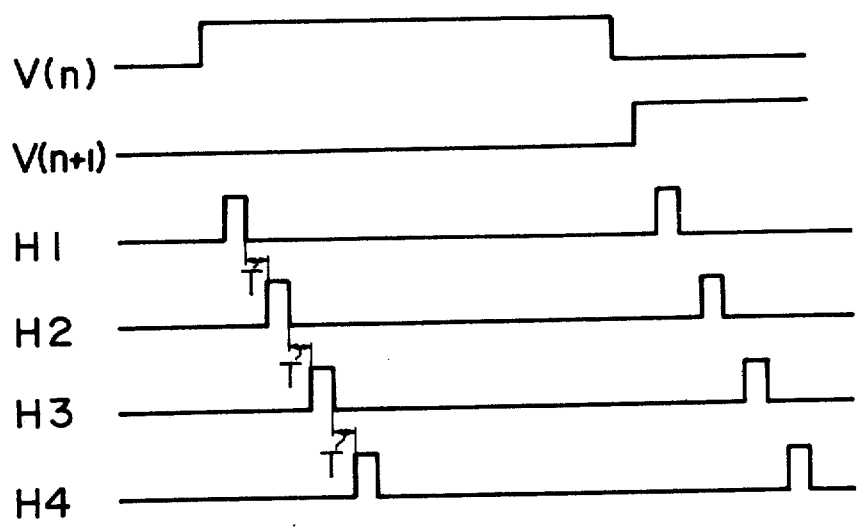
FIG. 2A
PRIOR ART

F I G. 9 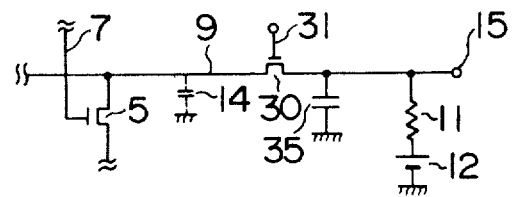
F I G. 10 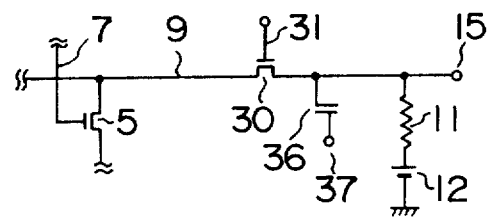
F I G. 11 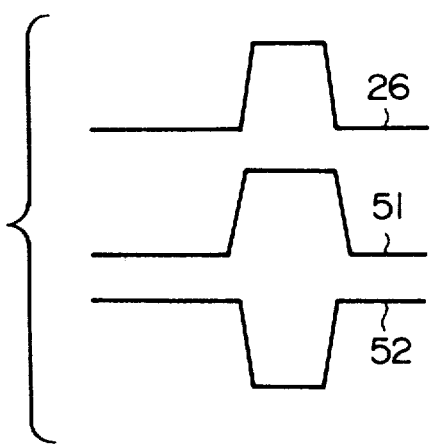

SOLID-STATE IMAGING DEVICE

This invention relates to a solid-state imaging device for use in a television camera, etc. Particularly, it relates to a solid-state imaging device which has a plurality of picture elements disposed in a surface region of a semiconductor body. More specifically, it relates to a signal read-out circuit in the solid-state imaging device which has picture elements for being read out from photodiodes photo information stored therein.

Prior art as well as this invention will be described with reference to the accompanying drawings, in which:

FIG. 1 schematically shows the circuit diagram of a conventional solid-state imaging device;

FIGS. 2A and 2B respectively show the typical waveforms of scanning pulses and the waveforms of output signals used in the solid-state imaging device shown in FIG. 1;

Figure 5:
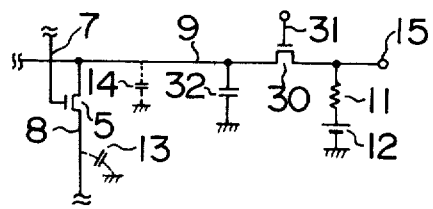
Figure 6:
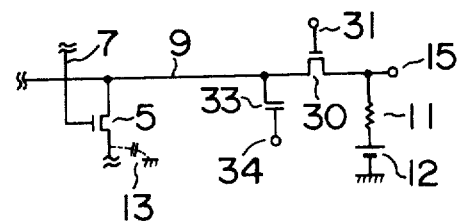
Figure 7:
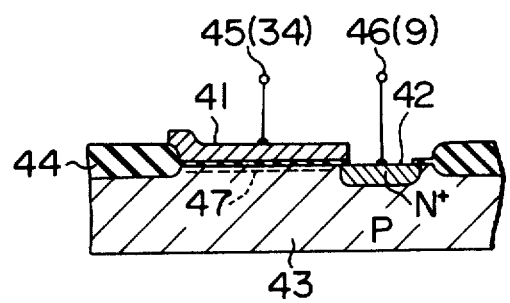
Figure 8:
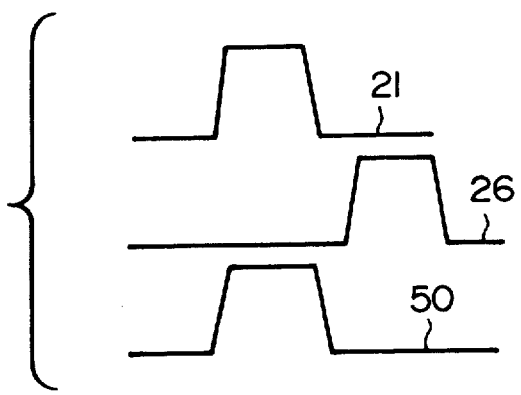

FIGS. 5 and 6 respectively show the circuit diagrams of solid-state imaging devices as other embodiments of this invention;

FIG. 7 shows in cross section an MIS type capacitance used in the embodiment shown in FIG. 6;

FIG. 8 shows the waveforms of various signals appearing in the circuit shown in FIG. 6;

FIGS. 9 and 10 show the circuit diagrams of solid-state imaging devices as further embodiments of this invention; and FIG. 11 shows the waveforms of various signals appearing in the circuit shown in FIG. 10.

As an image pickup device for use in a television camera, etc., a solid-state imaging device using semiconductor integrated circuits has come to be developed in place of the conventional image pickup tube.

FIG. 1 shows schematically a conventional solid-state imaging device. Upon incidence of light, a photodiode 3 stores photoelectrons in its junction capacitance if the photodiode is of N-channel type element. A positive scanning pulse generated by a vertical scanning circuit 2 turns on vertical switching MOS transistors 4 connected with a selected one of vertical scanning lines 6. On the other hand, scanning pulses generated by a horizontal scanning circuit 1 successively turn on horizontal switching MOS transistors 5 so that the photoelectrons stored in the photodiodes 3 are released therefrom to a signal output terminal 15 to provide a video signal. Usually, the video signal is utilized in the form of voltage fluctuation derived through a load resistance 11. Reference numeral 12 indicates a voltage source for video bias.

With this solid-state imaging device, if continuously chained scanning pulses without intervals are used as a horizontal scanning pulse chain, the (n+1)-th horizontal switching MOS transistor is turned on upon turn-off of the n-th horizontal switching MOS transistor. Accordingly, the residual part of charge for conduction trapped under the gate of the n-th horizontal switching MOS transistor is delivered as the (n+1)-th signal, resulting in one sort of fixed pattern noise.

The present invention, Ohba et al, therefore have proposed a scanning system wherein discontinuously chain scanning pulses with intervals are used as a horizontal scanning pulse chain (see Japanese Patent Application Laid-Open No. 27313/79 laid open on Mar. 1, 1979). FIG. 2A shows such discontinuous scanning pulses H1, H2, H3, H4 . . . Vertical scanning pulses are shown by $V_{(n)}$ and $V_{(n+1)}$. The horizontal scanning pulses H1, H2, H3, H4, . . . have interval times T established therebetween.

Figure 2B:
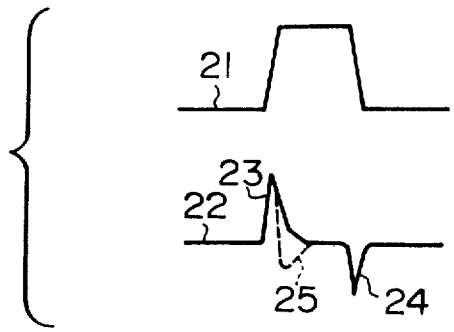

FIG. 2B shows the waveform 21 of a horizontal scanning pulse applied to the gate electrode of the horizontal switching MOS transistor 5 and also the waveform 22 of a signal pulse obtained at the signal output terminal 15. Voltage fluctuations 23 and 24 induced due to the parasitic capacitance 10 formed between the gate electrode of the MOS transistor 5 (or the horizontal scanning line 7) and a horizontal signal output line 9, are called spike noises. A broken curve 25 appears in the case where the signal charges are present. If the spike noise has the same shape at any given scanning point, it can be easily eliminated by the provision of a low-pass filter so that its disturbance to the produced video signal is hardly considerable. In practice, however, the shape and amplitude of the spike noise vary largely depending on the changes in the pulse waveform 21 and the threshold voltage Vth of the MOS transistor 5 and therefore the spike noise gives rise to a spurious signal. This spurious signal is superposed on the respective signals from the photodiodes 3 connected in common with a vertical signal output line 8 and therefore becomes causative of fixed pattern noise manifest as a vertical stripe (or belt) on a reproducing picture screen, greatly damaging picture quality. The signal charges derived from the photodiode 3 are of very small quantity. Therefore, it is greatly difficult to make the deviations of the scanning pulse waveform and the characteristics of the MOS transistor satisfactorily small in comparison with the small quantity of the signal charges. This provides a bar to the practical application of solid-state imaging devices.

The present inventors, Ohba et al, have also proposed signal processing circuits for solid-state imaging devices using a discontinuous horizontal scanning pulse chain, in which the video output signal is integrated by use of an emitter follower circuit (Japanese Utility Model Application Laid-Open No. 155426/79 laid open on Oct. 29, 1979, and Japanese Patent Application No. 12248/79 filed on Feb. 7, 1979 and not yet laid open). Though this signal processing circuit using the integrating circuit indeed can effectively eliminate the fixed pattern noise, the circuit itself is complicated.

This invention aims to solve the above-described problems and to provide a solid-state imaging device incorporating in a simple circuit configuration a signal processing circuit which can eliminate the fixed pattern noise due to the spike noise. Namely, the object of this invention is to provide a solid-state imaging device in which vertical stripes due to the fixed pattern noises can be prevented from appearing on the picture screen.

According to this invention, there is provided a solid-state imaging device comprising a two-dimensional array of photo-electric conversion elements, vertical and horizontal switching MOS transistors for transferring, to a signal output terminal, signals detected by said photo-electric conversion elements, vertical and horizontal scanning circuits for supplying scanning pulses to the gate electrodes of said vertical and horizontal switching MOS transistors respectively, and a switching gate MOS transistor connected between the horizontal switching MOS transistors (or a signal output line connecting horizontal switching MOS transistors) and the associated signal output terminal.

This invention will now be described in detail with reference to embodiment thereof.

Figure 3:
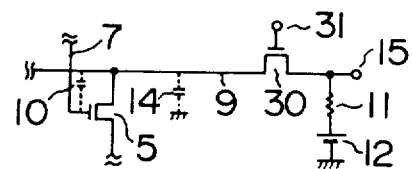
FIG. 3 shows the circuit diagram of a solid-state imaging device as an embodiment of this invention.
Figure 4:
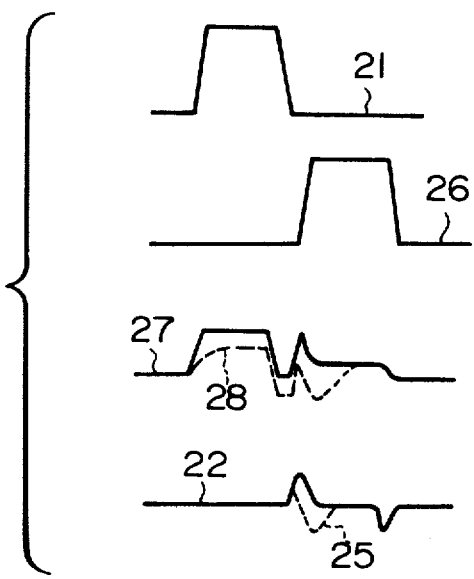
FIG. 4 shows the waveforms of various signals appearing in the circuit shown in FIG. 3.

FIG. 3 shows the circuit diagram of the essential part of a solid-state imaging device as an embodiment of this invention. A signal switching gate element, an insulated-gate FET (MOS transistor) 30 capable of being easily formed is inserted between the horizontal signal output line 9 and the signal output terminal 15. FIG. 4 shows the waveform 21 of a horizontal scanning pulse (one of discontinuously chained scanning pulses with intervals), the waveform 26 of a switching pulse supplied to the gate electrode 31 of the MOS transistor 30, the waveform 27 representing the change in the voltage at the horizontal signal output line 9, and the waveform 22 of a signal available at the signal output terminal 15. In the waveforms 27 and 22, solid curves correspond to the cases where there are no signa charges exist while broken curves correspond to the case where signal charges exist.

The MOS transistor 30 is turned on after the horizontal switching MOS transistor 5 is rendered off (that is, after the voltage at the signal line 9 has been released from the affect by the parasitic capacitance 10, restoring its initial state) and the MOS transistor 30 is turned off before the horizontal switching MOS transistor in the next row is rendered on. While the horizontal scanning pulse is being applied, the horizontal signal output line 9 is electrically disconnected from the signal output terminal 15 or the load resistance 11. Accordingly, no current flows through the path under consideration and therefore the affects due to the deviations of the waveforms of the scanning pulses and the characteristics of the MOS transistors can be eliminated. As shown in FIG. 4, the spike noise, which is generated through the switching action of the MOS transistor 30 alone, has in this case a constant shape and therefore is harmless since it can be easily eliminated by the provision of a low-pass filter or the like. This is also true of the following embodiments.

FIG. 5 shows another embodiment of this invention. In this embodiment, an additional capacitance 32 is connected with the horizontal signal output line 9. The operation of this embodiment is similar to that of the embodiment of FIG. 3.

Since the vertical signal output line 8 has a parasitic capacitance 13 with respect to the substrate (earth) and the parasitic capacitance 14 of the horizontal signal output line 9 is in series with the parasitic capacitance 13 between the vertical and horizontal signal output lines 8 and 9, signal charges having its amount proportional to the parasitic capacitance 13 are left on the vertical signal output line 8. If the parasitic capacitance 14 is much greater than the parasitic capacitance 13, no problem will arise (this is the usual case). However, if the parasitic capacitance 14 is not so large as compared with the parasitic capacitance 13, the remaining signal charges are superposed on the next signal to degrade the resolution in the vertical direction on the picture screen. This problem can be easily eliminated by providing the additional capacitance 32 much greater than the parasitic capacitance 13.

FIG. 6 shows still another embodiment of this invention. This embodiment employs a metal-insulator-semiconductor (MIS) type capacitance 33 to provide an additional capacitance whose value is variable. The structure of the MIS type capacitance 33 being shown in cross section in FIG. 7. When an insulated-gate electrode 41 having its structure similar to the gate electrode of a MOS transistor is applied with a potential sufficiently high with respect to a diffusion layer 42, an N-type inversion layer 47 formed due to electrons drawn out of the diffusion layer 42 expands into the surface region of a semiconductor substrate 43 under the electrode 41 so that the capacitance between terminals 45 and 46 becomes large. When the high voltage is removed, the inversion layer 47 disappears and the large capacitance vanishes. In the embodiment shown in FIG. 6, the terminal 46 is connected with the horizontal signal output line 9 and the terminal 45 corresponds to the terminal 34.

FIG. 8 shows the waveform 50 of a voltage pulse applied to the terminal 34. While the MOS transistor 5 is conducting, a positive pulse is applied to the terminal 34 and when the MOS transistor 30 turns on, the voltage is removed. As a result, the capacitance 33 becomes large when the signal charges are drawn out to the signal output line 9. This is the same effect as by the capacitance 32 in the embodiment of FIG. 5. On the other hand, while the signal is being read out (while the MOS transistor 30 is conducting), the capacitance 33 becomes small, resulting in a small time constant for signal readout and therefore an increased operation speed.

Even if the MIS type capacitance 33 is connected with its polarity inverted, a similar effect can be obtained. In this case, the waveform of the voltage pulse applied to the terminal 46 must be of inverted polarity with respect to the waveform 50 shown in FIG. 8.

FIG. 9 shows a further embodiment of this invention. In this embodiment, an additional capacitance 35 is connected with the horizontal signal output line 9 on the side of the output terminal 15 of the embodiment of FIG. 3. The capacitance 35 serves to absorb the signal charges from the horizontal signal output line 9, thereby assisting the switching function of the MOS transistor 30 and decreasing the quantity of the residual charges on the horizontal signal output line 9. This capacitance 35 may be also used in the embodiments of FIGS. 5 and 6.

FIG. 10 shows a still further embodiment of this invention. This embodiment can be realized by simply substituting an MIS type capacitance 36 as a variable capacitance for the capacitance 35 in the embodiment of FIG. 9. By applying a pulse voltage having a waveform 51 shown in FIG. 11 to the electrode 37, the capacitance 36 becomes large while the MOS transistor 30 is conducting, so that the signal charges are rapidly transferred from the horizontal signal output line 9 to the signal output terminal 15. Thereafter, the capacitance 36 is made small so that the time constant for signal readout is reduced to increase the operation speed. This capacitance 36 may also be used in the embodiments of FIGS. 5 and 6.

Similarly to the case of the embodiment of FIG. 6, the connection of the MIS type capacitance 36 may be inverted to obtain similar effect if the polarity of the pulse waveform is also inverted.

The embodiment shown in FIG. 10 provides another measure for improvement. Namely, if the conductance of the MOS transistor 30 becomes so high as to be independent of the parasitic capacitances associated with the load resistor 11, the horizontal signal output line 9 and the signal output terminal 15, then the MIS type capacitance 36 may be omitted owing to the above-described effect. However, a MOS transistor having a high conductance is usually of great size so that the large-conductance MOS transistor generates much of the above-described spike noise. Although the spike noise can be eliminated by the provision of a low-pass filter, it is a harmful thing in the amplification process and therefore should be prevented from being generated. According to this embodiment, by applying a pulse having such a waveform 52 as shown in FIG. 11 to the electrode 37 of the MIS type capacitance 36, the polarity of the waveform 52 being opposite to that of the waveform 26 of the pulse applied to the gate electrode 31 of the MOS transistor 30, the spike noise due to the inverse capacitive coupling is sent to the signal output terminal 15 so as to cancel spike noise. Accordingly, the signal can be derived independently of noise so that signal processing can be facilitated.

Throughout all the above-described embodiments of this invention, the switching gate MOS transistor 30 may employ any switching transistor such as a junction gate or type FET, a Schottky barrier FET or a bipolar transistor in place of the shown insulated-gate FET.

As described above, according to this invention, the fixed pattern noise most serious with a solid-state imaging device can be easily eliminated and therefore a practical solid-state imaging device capable of producing high quality pictures can be provided.

What is claimed is:

1. A solid-state imaging device comprising a two-dimensional array of photo-electric conversion elements, vertical and horizontal switching MOS transistors for transferring, to a signal output terminal, signals detected by said photo-electric conversion elements, vertical and horizontal scanning circuits for supplying scanning pulses to the gate electrodes of said vertical and horizontal switching MOS transistors respectively, and a switching gate MOS transistor connected between the horizontal switching MOS transistors and the associated signal output terminal.

2. A solid-state imaging device as claimed in claim 1, wherein said switching gate MOS transistor is turned on when said horizontal switching MOS transistor is turned off.

3. A solid-state imaging device as claimed in claim 2, wherein a capacitance is connected at one end with the horizontal signal output line between said switching gate MOS transistor and said horizontal switching MOS transistors.

4. A solid-state imaging device as claimed in claim 3, wherein said capacitance is of MIS type variable capacitance.

5. A solid-state imaging device as claimed in claim 4, wherein a predetermined voltage is applied to the other end of said MIS type variable capacitance while said horizontal switching MOS transistor is conducting.

6. A solid-state imaging device as claimed in claim 2, wherein a capacitance is connected at its one end with the horizontal signal output line between said switching gate MOS transistor and said signal output terminal.

7. A solid-state imaging device as claimed in claim 6, wherein said capacitance is of MIS type variable capacitance.

8. A solid-state imaging device as claimed in claim 7, wherein a predetermined voltage is applied to the other end of said MIS type variable capacitance while said switching gate MOS transistor is conducting.

9. A solid-state imaging device as claimed in claim 5 or 8, wherein said predetermined voltage has the same polarity as the voltage applied to the gate electrode of said switching gate MOS transistor.

10. A solid-state imaging device as claimed in claim 5 or 8, wherein said predetermined voltage is opposite in polarity to the voltage applied to the gate electrode of said switching gate MOS transistor.

11. A solid-state imaging device as claimed in claim 1, wherein said horizontal scanning circuit supplies discontinuously chained horizontal scanning pulses with intervals therebetween.

* * * * *